United States Patent [19]

Ovshinsky et al.

[11] Patent Number: 5,694,054
[45] Date of Patent: Dec. 2, 1997

[54] INTEGRATED DRIVERS FOR FLAT PANEL DISPLAYS EMPLOYING CHALCOGENIDE LOGIC ELEMENTS

[75] Inventors: Stanford R. Ovshinsky, Bloomfield Hills; Guy C. Wicker, Southfield, both of Mich.

[73] Assignee: Energy Conversion Devices, Inc., Troy, Mich.

[21] Appl. No.: 565,187

[22] Filed: Nov. 28, 1995

[51] Int. Cl.⁶ .......................... H03K 19/00; H03K 19/23
[52] U.S. Cl. .................. 326/35; 326/93; 326/136
[58] Field of Search .................. 326/93, 104, 136, 326/35, 82; 327/108, 109; 340/825.81, 825.85; 257/4, 613

[56] References Cited

U.S. PATENT DOCUMENTS 4,731,610  3/1988  Baron et al. .......................... 340/784
4,782,340  11/1988 Czubatyj et al. .................. 340/825.81
5,543,737  8/1996  Ovshinsky ........................... 326/96

*Primary Examiner*—Edward P. Westin
*Assistant Examiner*—Richard Roseen
*Attorney, Agent, or Firm*—David W. Schumaker; Marvin S. Siskind; Marc J. Luddy

[57] ABSTRACT

The present invention defines a display driver for driving a flat panel display having rows and columns. The display driver has row and column drivers comprised of logic gates where each logic gate includes chalcogenide threshold switches. The logic gates of the present invention use a chalcogenide threshold switch as a means of discharging load capacitance and resetting logic gate output.

19 Claims, 7 Drawing Sheets

INTEGRATED DRIVERS FOR FLAT PANEL DISPLAYS EMPLOYING CHALCOGENIDE LOGIC ELEMENTS

FIELD OF THE INVENTION

The instant invention relates to a novel logic family. More specifically the present invention relates to a logic family which employs two-terminal chalcogenide switches as the logic gates therein.

BACKGROUND OF THE INVENTION

In the field of electronic computers which is constantly striving for improvements in operational speed and performance, the silicon semiconductor devices used in most electronic computers have begun to reach a limit in operating speed and device size/packing density. Computer designers are always looking to reduce the switching time of switching circuits and to increase their packing density so as to permit the execution of the greatest number switching operations per unit time and yet reduce the space occupied by the switching circuits. Josephson devices have attracted keen attention in the past as one potential novel breakthrough toward satisfying these requirements, and thus logic circuits which incorporate these devices have been heavily studied. The use of Josephson junctions as electronic circuit elements only became possible after 1962 when the Josephson effect was discovered. At that time the only known superconducting materials had such low critical temperatures (i.e., temperatures below which the material becomes superconducting) that any circuit using Josephson junction elements required a source of liquid helium to maintain the low temperature required. Since that time the improvements in low-temperature technology, and the discovery of high $T_c$ superconducting materials, have made these limitations less serious, but other practical considerations still plague commercialization of superconducting logic circuits.

Josephson junctions are highly-unusual, nonlinear circuit elements which can be used to design circuits having many interesting properties. The primary advantages of these junctions are said to be their low power requirements and high operating speeds compared with conventional, nonlinear circuit elements. That is, the Josephson device exhibits high-speed switching operations with low power dissipation and high sensitivity in accordance with the Josephson effect produced in a superconductive state at very low temperatures. Therefore, the Josephson device has, in the past, given rise to expectations for materialization of super-high speed computers.

The Josephson device, in its basic construction, comprises two superconductors joined to each other through the medium of a thin insulating film (Josephson tunneling junction) as typified by the Josephson tunnel junction device. In this construction, when the current supplied to the junction exceeds the junction's critical current, the device is transferred from the zero-voltage state to the voltage state (a switching operation). That is, the operation of the device is based on the existence of two states for the gate (Josephson junction) and the fact that the gate can be switched from one state to the other by means of a magnetic field or applied current. One of these states is a pair tunneling state of the junction in which current can flow through the barrier region without any voltage drop. The other state is a single-particle tunneling state in which the current flows with a voltage across the junction equal to 2 Delta , where Delta is the energy gap of the superconductor. For tin, 2 Delta equals about 1 mV at 1.7 K. The transition from one state to the other can be brought about by exceeding the critical current for the Josephson junction. The critical current, $I_J$, is defined as the largest zero voltage current the junction can carry. Therefore, the device's I-V characteristics are such that the voltage across the junction remains at zero until the current reaches a critical value at which time the voltage across the device jumps to a finite value and thereafter varies slowly with further increase in current. The critical current value is dependent upon the magnetic field applied to the Josephson device.

U.S. Pat. Nos. 3,626,391; 3,281,609; 3,758,795; 3,825,906, etc. disclose the concept of utilizing a Josephson junction for Josephson circuit devices as, for example, a memory cell, logic gate or shift register.

There are two basic types of Josephson logic gates, current injection gates and magnetically controlled gates. All present day Josephson integrated circuits utilize one or both of these gate types. The fastest logic gates utilize a combination of the two. All of these types of Josephson integrated circuits are subject to the disadvantages described hereinbelow.

Conventional superconductive logic circuits are roughly classified by the input system into the magnetic coupling type and the current injection type. In a superconductive logic circuit of magnetic coupling type, an input signal is magnetically coupled to a loop including a Josephson junction and inductance, and logic operations are performed by transformation of the Josephson junction to the non-zero voltage state as shown in U.S. Pat. No. 3,978,351. In this example, the Josephson junction and the inductance constitute a magnetic flux quantum interferometer, and the product of the inductance L and the and the critical current $I_J$ of the Josephson junction is selected to be close to one magnetic flux quantum. Therefore, when the critical current $I_J$ is made small for energy consumption, a large inductance L is required, making it difficult to realize a compact circuit and reducing the operating speed. Conversely, when the inductance L is made smaller for obtaining a higher operating speed, the value of the critical current $I_J$ becomes greater and energy consumption increases. Further, the circuit is subject to the influence of external magnetic noise, stray inductance and so on, resulting in extreme fluctuations and unstable operation. Such a circuit is also defective in that uniform and efficient connection of a number of input wires is structurally difficult.

A superconductive logic circuit of current injection type has been an improvement in that it does not involve a magnetic flux quantum interferometer. In a superconductive logic circuit of current injection type, current is directly supplied to the Josephson junction for switching into the non-zero voltage state in order to perform logic operations. A prior art superconducting logic circuit of the current injection type which does not involve a magnetic flux quantum interferometer is shown in IEDM "Josephson Direct Coupled Logic (DCL)" (1492, 12), IBM. According to this example, the defects of the superconductive logic circuit of the magnetic coupling type which involve magnetic flux quantum interferometer are solved. However, the threshold for determining the sensitivity is solely determined by the switching of the non-zero voltage state of a single Josephson junction so that only a current gain of at most 1 may be obtained. Therefore, although it is advantageous to use it as a switch, it is difficult to apply it to various kinds of logic circuits.

In an article entitled "Threshold Logic" by Daniel Hampel and Robert Widner, published in IEEE Spectrum, May, 1971, pp. 32–39, threshold logic gates and means for implementing such gates with large scale integrated circuitry are disclosed. As pointed out in the article, threshold logic gates have increased logic power over standard Boolean logic gates such as AND, OR, NOR gates. Basically, a threshold logic gate receives N logic inputs, weights the N inputs either equally or with unequal weights, sums the weighted inputs, and provides a logic output if the sum is greater than or equal to a threshold weighting factor.

Conventional threshold logic is implemented by using either of the current sources and a threshold detector, or magnetic flux summing techniques described above. Current summing techniques and magnetic flux summing techniques require precision in generating the analog quantity which will be compared to the threshold. Precision is also required when Josephson devices are used. The source of analog precision is provided in the Josephson case by voltage referred to above as Delta. The parameter Delta is essentially the gap in the energy spectrum of the conduction electrons of the superconductor being considered and as such is a material constant.

Logic circuits incorporating Josephson junctions have other disadvantages in addition to those discussed above. For instance, some switching circuits in Josephson junction technology have the severe disadvantage of not being automatically resetting, thus requiring additional switches for their reset operation. While this would not pose a technical problem, the economics of any device incorporating the state of the art switching circuits must suffer considerably through long cycle times. Another disadvantage is the problem of eliminating cross-talk between Josephson devices in Josephson logic arrays, which are due to current transients when a device switches. Also, the current-voltage characteristic of a Josephson tunnel junction device is known to have an unstable region at low voltages. If one attempts to voltage bias the device in the unstable region, its operating point jumps back and forth between the supercurrent state (V=0) and the finite voltage state (V not=0, typically V=2 DELTA, the gap voltage of the superconductor). This problem is known as relaxation oscillation.

Therefore, the conventional Josephson device has been unable to simultaneously satisfy three conditions, i.e., (1) the size reduction of the device which permits integrated circuits in high density, (2) the high sensitivity which produces wide operation margin, and (3) perfect isolation between the input and output signal currents in the device. The three conditions are indispensable to the components of future electronic computers to obtain stable, high-speed logic circuit operation.

Another disadvantage of Josephson junction technology is the large number of processing steps required to produce the devices. A primary factor determining the efficacy of integrated circuit processes and the concomitant yield thereof is the number of steps comprising the process. For example, if a process consists of twelve steps and the expected yield of each of the steps is ninety percent, then the yield of operative devices at the completion of the twelve step process is $0.9^{12}$, or approximately 28%. If, however, the process consists of eight steps, each with a yield probability of ninety percent, then the final yield for the eight step process is $0.9^8$, or 43%. Thus by eliminating steps, an improvement in yield is achieved without any improvement in the quality of the processing. Additionally, large numbers of processing steps engender problems with adhesion, step coverage and damage to prior deposited layers. The longer the fabrication sequence, the lower is the device throughput of the process.

Josephson junction logic integrated circuit fabrication involves approximately 12 deposition steps, 12 photoresist steps, an anodization step and a junction barrier formation step. Typically the process comprises depositing four superconducting layers, viz., the ground plane, the lower Josephson electrode, the Josephson counter electrode and the control lines. Interconnections, interferometer loops and other circuit elements are formed from the last three layers. Each superconductive layer is separated from an adjacent superconductive layer by an insulator layer that is patterned to form vias which provide required electrical connections between layers. The deposition of resistors, additional insulator layers for increased inductance, passivation layers and anodization are steps utilized to complete the circuit. Thus it is appreciated that a minimum of nine separate thin films and patterning steps are required in this process. Therefore a reduction in the number of processing steps required to form the logic circuits is desirable.

A switching technology which is similar to Josephson junction technology and which has been around for 30 years is the Ovonic threshold switch. This device starts in the "off" or non-conducting state and a critical voltage is required to switch it on. Its I-V characteristic looks like that of the Josephson junction, but the current and voltage axes are transposed. Its switching speed, like that of the Josephson junction, is also limited by the device capacitance, but since the devices are thicker, it exhibits a lower capacitance for a given lithography. Additionally, the speed/power potential of the Ovonic Threshold Switch compares favorably with the silicon and gallium arsenide technologies as well as the practical implementations of Josephson logic.

Now that the end of the dramatic density increases in silicon technology is at hand, the real need in advanced logic is to find a superior future technology which can replace silicon transistors.

Therefore one object of this invention is to define a novel logic family which employs chalcogenide Ovonic threshold switches as the logic gates therein.

SUMMARY OF THE INVENTION

The present invention defines a logic operation circuit comprising at least one logic gate. Each logic gate comprises: a first chalcogenide threshold switch connected at one end to an activation point and at the other end to a second chalcogenide threshold switch; at least one input resistor connected at one end between the first and second threshold switches and at the other end to a unique input point; a third threshold switch connected at one end to the second threshold switch at the terminal opposite that of the junction of the first and second threshold switches, the second threshold switch is connected at the other end to a reset point; and an output point connected between the second and third threshold switches.

The present invention also defines a display driver for driving a flat panel display having row and column driving lines. The display driver comprises a plurality of logic gates wherein each logic gate comprises: a first and a second chalcogenide threshold switch connected in series; and at least one input resistor, each input resistor connected at one end to a point between the first and second threshold switches and at the other end to a unique input point.

DETAILED DESCRIPTION OF THE INVENTION

Figure 1:
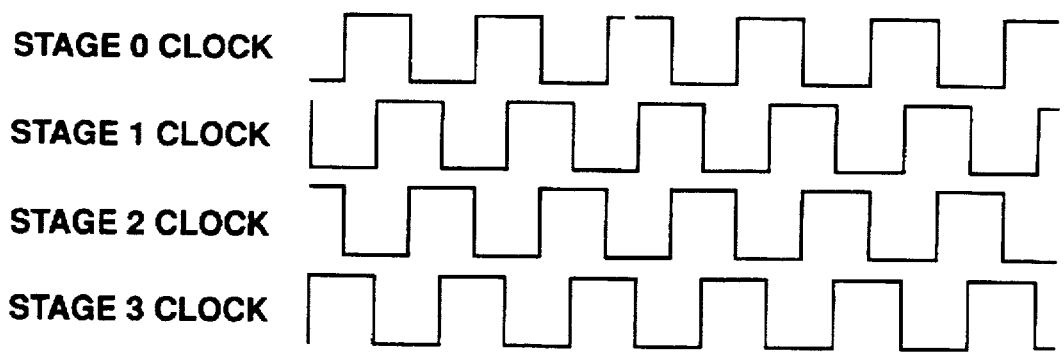
FIG. 1 depicts the power cycling of a four-phase clocking cycle for instituting two terminal logic, specifically shown is a fours-phase clocking cycle where each subsequent clocking wave is 90 degrees out of phase from the previous clocking wave.

A logic family is defined as a set of all possible logic circuits which can be formed using a particular logic gate or switching element. The present inventors have developed a logic family based upon two-terminal chalcogenide switches. The materials and processes for constructing these switches and their electronic characteristics are well known in the art and, as such, will not be repeated herein.

A logic family has a number of fundamental requirements necessary to it's use in computers. The most fundamental of these requirements is the ability to convert a binary "one" to a binary "zero" and vice versa. This ability is known as inversion. The second most important consideration is the ability to perform a logical operation. Common logic operations are AND, OR, NAND, NOR, etc. There are others, but any one of these will be sufficient. The third major consideration is that the logic family must have the ability to produce gain. That is, the output from one logic circuit must have the ability to provide input for more that one other circuit at the same time. Finally, if the logic gate or switching element has a latching property (i.e. the device does not automatically shut off, but must be turned off), means must be provided for resetting the gate/switch for subsequent switches. Having exhibited all of these requirements, a gate/switch and the logic family derived therefrom will have the ability to be used as computer logic.

While these are the only technical requirements for a logic family, there are other important engineering criterion which must be placed upon the gate/switching device for the purpose of practical implementation. First, it should be noted that the switching speed of the gate/switch is directly related to the speed of the computer and therefore, the lower the switching speed of the gate.switch, the faster the computer can be. Next, the size of the device directly determines the maximum possible density of the circuitry. Also, the power dissipated by the device must be considered in the design of the circuit so the thermal energy generated may be removed properly. Additionally, the logic circuits must be fairly resistant to noise. That is, the gate's/switch's noise immunity must be high enough that no false signals are introduced into the system. Finally, the costs of production (i.e. cost of raw materials, manufacturing, labor etc.) are another constraint to practical implementation of any new logic family.

The present logic family based on two-terminal chalcogenide switches meet all of the technical and engineering requirements of a logic family. First we shall discuss the technical limitations of a logic family in comparison with the capabilities of the threshold switch logic family of the instant invention, with reference to the figures.

One of the technical considerations mentioned above is a gate's/switch's latching property. A two-terminal chalcogenide threshold switch, such as the Ovonic Threshold Switch (OTS), has the latching property. That is, once it's threshold voltage is reached, the OTS switches on and current is allowed to pass therethrough. Once switched on, the OTS remains on until the current passing therethrough falls below a critical value known as the holding current.

Figure 2:
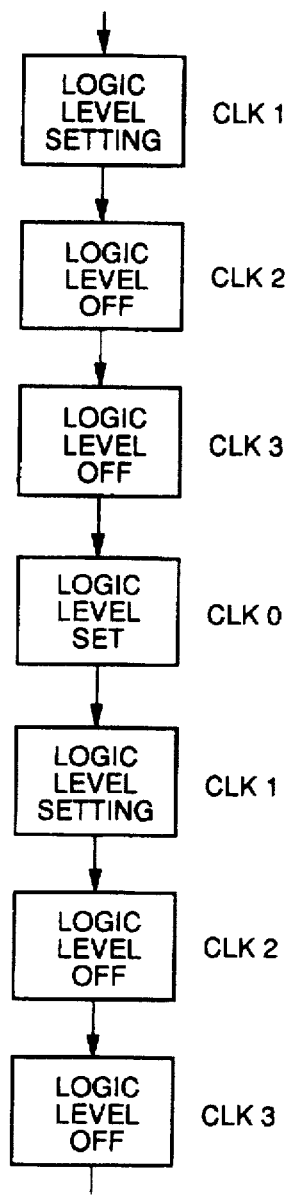
FIG. 2 depicts the manner in which four-phase clocking allows the logical output of a logic circuit to be passed to the next logic circuit in a logic chain without affecting other logic circuits in the logic chain.

To insure that the logic gates/OTS's of the logic family of the instant invention turn off when required, the current passing therethrough must be stopped. One way to accomplish this is with the use of a four-phase clocking system. FIG. 1 shows the power signals for a four-phase clocking system. It can be seen that the four stages of the clocking system are each 90 degrees out of phase from the stage preceding it. This four-phase clocking system allows for proper transfer of data from one logic circuit to the next. To visualize just how this is accomplished, look at the flow chart depicted in FIG. 2. The clock cycle is at a point at which both the stage 0 and stage 1 clocks are powered and the stage 3 and stage 4 clocks are unpowered. At this point the logic circuit being supplied by clock 0 have performed their logical function and are transferring their output to the next logic circuit(s) in their logic path, which are powered by the stage 1 clock. Therefore, the logic circuits powered by the stage 1 clock are said to be "being set". It should be noted that since both the stage 2 and 3 clocks are unpowered during this time period, the logic circuits and their OTS's are closed and no information is passed into or out of these circuits (thus aiding in providing for noise immunity). Once the stage 1 clock logic circuits are set, the stage 0 clock is powered down and the stage 2 clock is powered up. Now the logical output of the stage 1 clock logic circuits is passed to the stage 2 clock logic circuits. Then the stage 1 clock is powered down and the stage 3 clock is powered up. The cycle is then completed by powering down the stage 2 clock and powering up the stage 0 clock again. While FIG. 1 depicts four-phase clocking of equal on and off duration (i.e. a 50% duty cycle) with each phase being offset by 90 degrees from the preceding clock, there are many other ways to implement four-phase clocking. Four-phase clocking is well known in the two-terminal logic art and is described by W. F. Chow, "Principles of Tunnel Diode Circuits", John Wiley & Sons, Inc. 1964, pp. 253–254.

Figure 3:
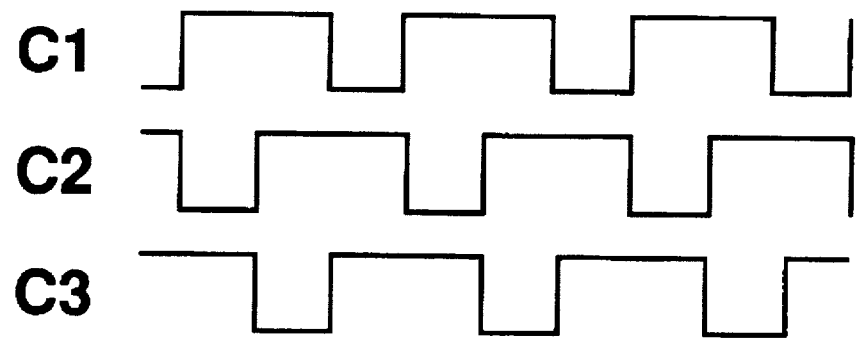
FIG. 3 depicts the power cycling of a three-phase clocking cycle for instituting two terminal logic, specifically shown is a three-phase clocking cycle where each subsequent clocking wave is 120 degrees out of phase from the previous clocking wave.

Logic circuits using chalcogenide threshold switches can also be implemented using a three-phase clocking scheme. FIG. 3 shows the power signals for a three-phase clocking system. The three stages of the three-phase clocking system are denoted as C1 for "stage 1", C2 for "stage 2" and C3 for "stage 3". The three stages of the clocking system are each 120 degrees out of phase from the stage preceding it. In three-phase clocking, each cycle of a phase is divided into three segments. During the first segment, the stage of logic is being set. During the second segment, the stage is transferring its signal to the subsequent stage of logic. During the third segment, the output of the stage is being reset to ground potential. Implementation of a three-phase clocking scheme requires that the logic gates comprising a logic operational circuit be divided into stage 1, stage 2 and stage 3 logic gates. The appropriate stage for each gate depends upon its position within the circuit relative to the other gates and to the input of the circuit. Stage 1, stage 2 and stage 3 gates will have their CLK terminals connected to the C1, C2 and C3 phased clocks respectively.

Figure 4:
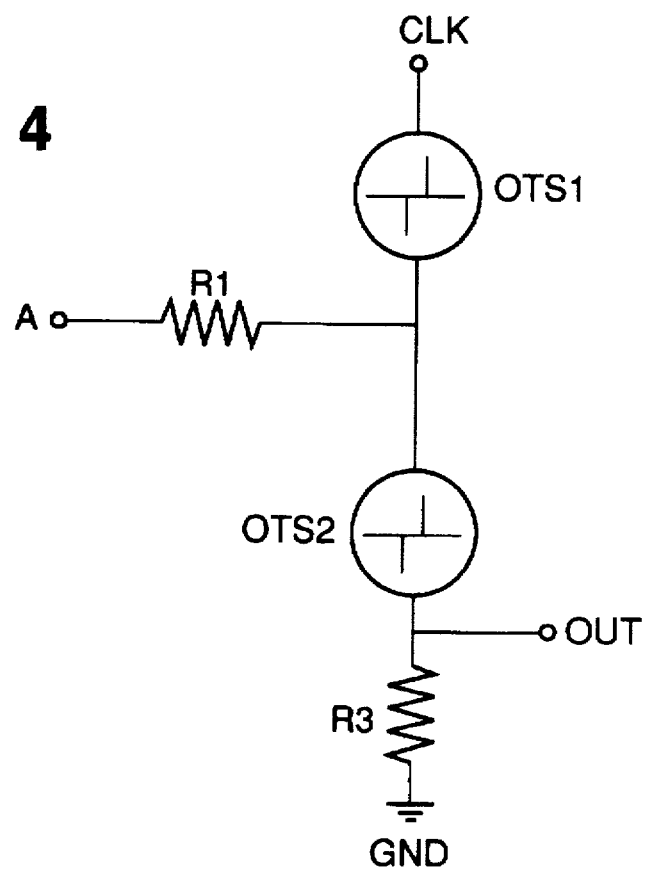
FIG. 4 depicts a single input inverting buffer by inverting the input and providing the boosted inverted signal as the output.

Another technical requirement for a logic family is the ability to convert a binary "one" to a binary "zero" and vice versa. This is known as INVERSION. FIG. 4 depicts an "INVERTER" circuit which provides the instant logic family with the INVERSION ability. This circuit may also be thought of as an inverting buffer, since the signal is merely inverted and passed to the next circuit, having had no logical operation performed upon it. The circuit includes two OTS's OTS1 and OTS2 which are connected in series. A data input point A is connected to an input resistor R1, which is in turn connected between the two OTS's. The power clocking signal is input at the CLK terminal of OTS1 which is opposite the junction point of R1, OTS1 and OTS2. The terminal of the second switch OTS2 which is opposite that of the R1-OTS1-OTS2 junction point is connected to ground (GND) through a resistor R3. A data output point is connected between the second switch OTS2 and the R3 resistor. In general, the resistance value of R1 is much greater than the resistance value of R3. During the operation of this circuit the clock is high, i.e. the circuit is powered and the potential at CLK is high. Accordingly, if the input signal at A is also high, there is not enough potential across OTS1 to cause it to switch, i.e. exceed its threshold voltage. There is also not a large enough potential across OTS2 to cause it to switch. Therefore, the potential of the output at OUT is low. Conversely, if the input signal at A is low, there is a large enough potential across OTS1 to exceed its threshold and the impedance of the switch drops. This then creates a large enough potential across OTS2 to allow it to switch and the potential of the output signal is pulled high.

Figure 5:
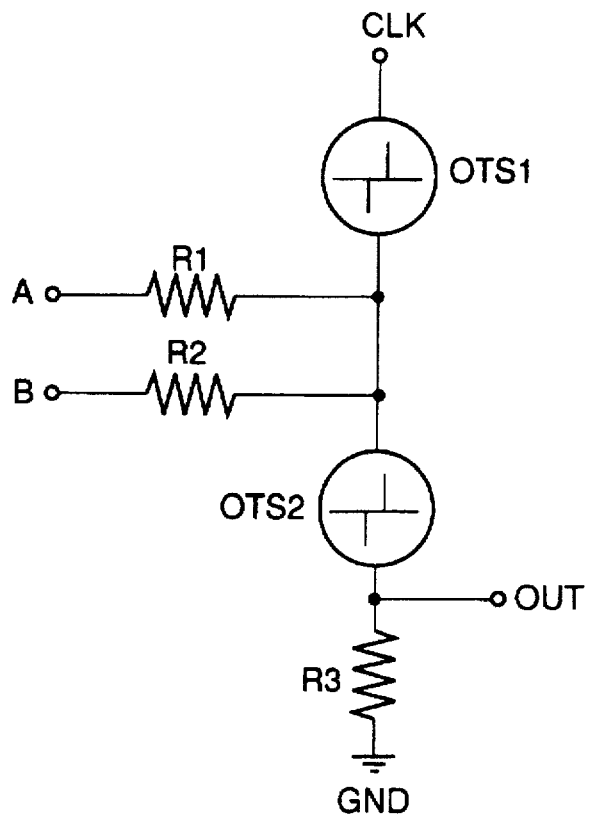
FIG. 5 depicts a multiple input logic circuit which performs a logical operation using two terminal chalcogenide switches, this circuit also preforms an inversion and provides gain.

Yet another of the technical requirements for a logic family is the ability to perform logical operations. FIG. 5 depicts a circuit within the instant logic family which fulfills this requirement. The circuit is basically the same circuit as the INVERTER circuit of FIG. 4 except that there is an additional input B with its attendant input resistor. Therefore, there are two inputs A and B each having their respective input resistors R1 and R2. The ground resistor has been designated R3 in this circuit. As in the INVERTER circuit, the resistance values of resistors R1 and R2 are much larger than the resistance value of ground resistor R3. This circuit operates in much the same manner as the INVERTER circuit of FIG. 3, the main difference being that there are now two inputs and a logical operation is performed upon the inputs. Again during operation of this circuit the potential at CLK is high. If the input at either A or B is high or the input at both A and B are high, OTS1 does not switch. Therefore OTS2 does not switch and the output is low. However if the input at both A and B is low, OTS1 switches. This causes the potential across OTS2 to be high causing it to switch and pulling the output at OUT high. Depending upon the nomenclature used, this is either a NOR gate or a NAND gate. That is, if a low potential is a logical "0" and a high potential is a logical "1" then the circuit acts as a NOR gate. Conversely, if a low potential is a "1" and a high potential is a "0" then the circuit acts as a NAND gate. Altering the threshold voltage of the switches such that any input going low will switch OTS1, also changes a NOR to a NAND logic gate.

Logic gates performing logical operations are not limited to only two inputs as shown in FIG. 5. Any number of input resistors may be used. Moreover, the input resistors are not confined to having the same values.

Figure 6:
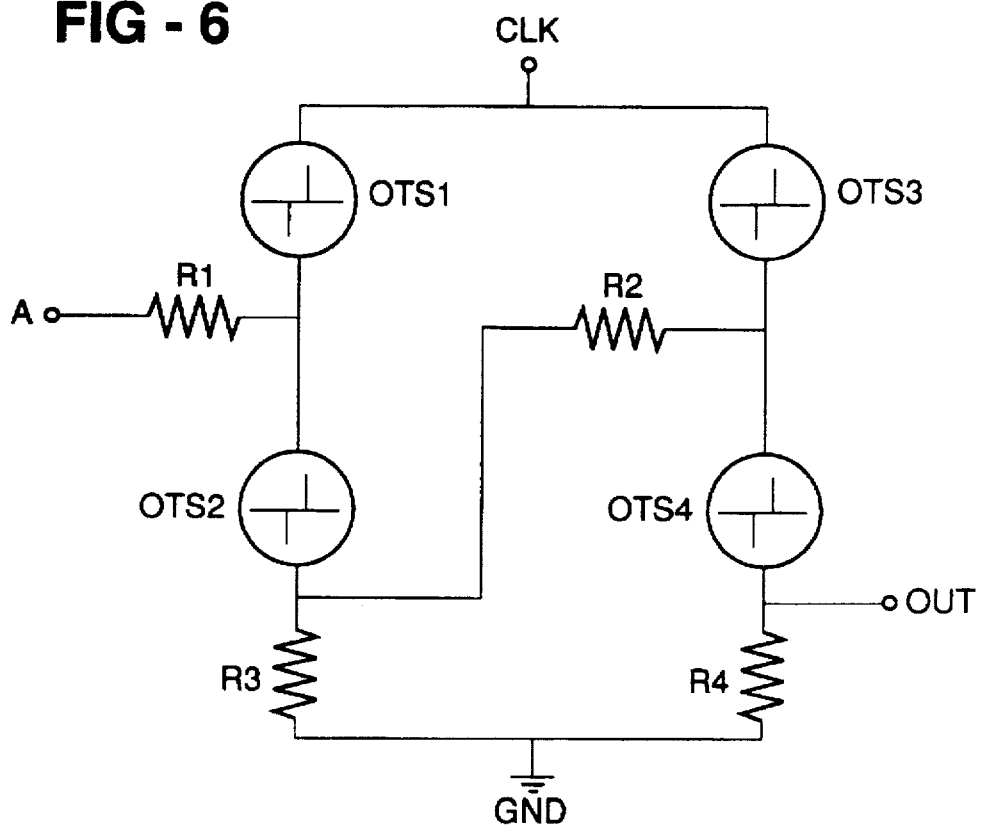
FIG. 6 depicts a non-inverting buffer which is formed by joining two of the inverter circuits of FIG. 3 together such that the output of the first inverter is fed to the input of the second inverter, using this configuration, the input signal is essentially passed through the total circuit and is merely boosted in power.

Another example of a logic circuit from the logic family of the instant invention is the non-inverting buffer depicted in FIG. 6. This is essentially two inverting buffers connected such that the output of the first inverter is fed to the input of the second inverter. Thus, the signal is inverted and re-inverted in a single clock cycle. Therefore, the signal is passed essentially unchanged through this circuit. Again the resistance values of input resistors R1 and R2 is much larger that the resistance values of ground resistors R3 and R4.

The last technical consideration is that the logic family must have the ability to produce gain. The circuits described above inherently produce gain. That is, the output at OUT of each of the aforedescribed circuits is pulled to nearly the potential of the clock powering signal, i.e. the potential at CLK, with an impedance substantially lower than the input impedance. Therefore, no special additional gain circuitry is required.

Therefore, all of the fundamental requirements of a logic family have been met. While the instant disclosure has presented specific circuitry which belong to the present logic family, they are merely exemplary and are not intended to limit the scope of the invention. One skilled in the art will recognize that there are a multitude of other circuits within the instant logic family which can be created to perform similar tasks to those disclosed.

Figure 7:
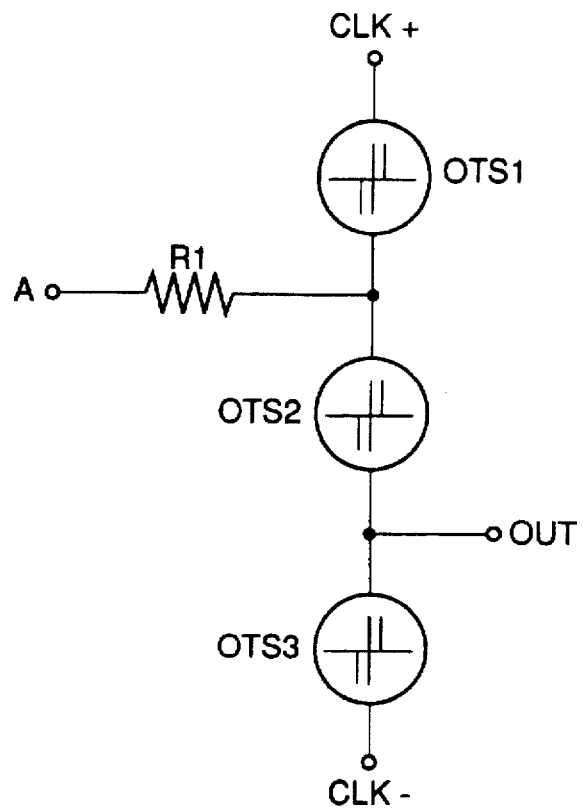
FIG. 7 depicts a single input inverting logic circuit which performs the logical operation using three two terminal chalcogenide threshold switches.

A logic family of logic operational circuits may also be comprised of logic gates that use a third OTS switch in place of a ground resistor. FIG. 7 shows an embodiment of the present invention comprising three OTS's. OTS1 is connected at one end to OTS2 and, at the other end, to the CLK+ terminal. The CLK+ terminal is the activation point for the logic gate. In this embodiment, a single input resistor is connected at one end to the OTS1-OTS2 junction. The input resistor R1 is connected at the other end to a unique input point A. A third OTS switch, OTS3 is connected, at one end, to OTS2 at the point opposite the OTS1-OTS2 junction. The other end of OTS3 is connected to the CLK– terminal. The CLK– terminal is the reset point for the logic gate. Finally, the output point OUT is connected to the OTS2-OTS3 junction.

Figure 8:
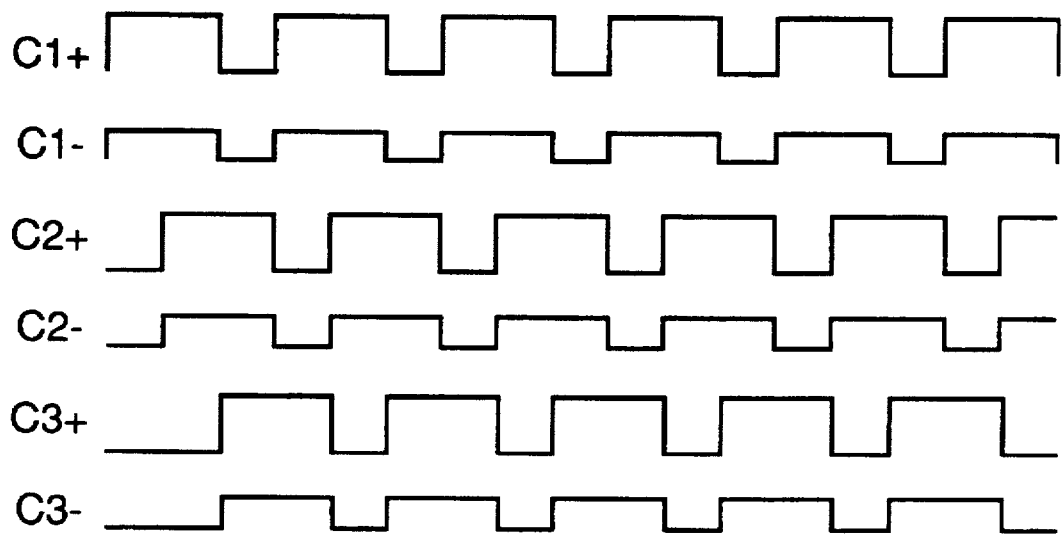
FIG. 8 depicts the power cycling of a three-phase clocking cycle for instituting logic gates comprising three two terminal chalcogenide threshold switches, where the third threshold switch is used to reset the output.

The logic gates of the present invention employ multi-phase clocking. The multi-phase clocking scheme used may be either four-phase clocking with a 50 percent duty cycle or three-phase clocking. Preferably the clocking scheme used is three-phase clocking. FIG. 8 shows a three-phase clocking scheme that can be used with the present invention. C1+, C2+ and C3+ are connected to the CLK+ terminals (the activation points) of the first, second and third stages of logic gates respectively. As well, C1−, C2− and C3− are connected to the CLK− terminals (the reset points) of the first, second and third stages of logic gates respectively.

As mentioned above, the key difference between this circuit and that shown in FIG. 4 is that the load resistor is replaced by a third OTS device. Instead of a resistor to ground, the third OTS device is attached to a reset clock pulse at the CLK− terminal which switches to a predetermined negative voltage during the reset phase.

Referring to the logic gate shown in FIG. 7, and the clocking signals shown in FIG. 8, during the first two phases of the three-phase clock cycle, the "set" and "transfer" phases, the potential at CLK+ is set to a predetermined high value. If the input signal at A is also high, the voltage across OTS1 does not exceed the threshold and OTS1 cannot switch. Furthermore, the high input signal at A is insufficient to allow OTS2 to switch. Hence, the output voltage at OUT will be low.

If the input at A is low, the voltage at CLK+ is then sufficient to create a voltage across OTS1 that exceeds the threshold and OTS1 will switch. After OTS1 switches, the potential across OTS2 will also exceed the threshold and OTS2 will switch, bringing the output voltage high. During the first two phases of the three-phase clock cycle, the voltage at CLK− is set so that OTS3 will not switch regardless of whether the voltage at input A is high or low.

During phase three (the reset phase) of the three-phase clock cycle, the voltage applied to CLK− drops to a level chosen so that OTS3 will switch provided the output voltage is high. If the output voltage is low, the voltage across OTS3 does not exceed the threshold and OTS3 does not switch. However, if the output voltage is high, the potential across OTS3 is sufficient to allow OTS3 to switch. When OTS3 switches, the output voltage will be brought low, thus resetting the logic gate between clock cycles.

Using a third OTS to reset the logic gate is a great advantage, especially when the output line is long, creating a significant load capacitance. In such instance, the RC time constant created by the load capacitance and load resistor would be substantial and discharging the load capacitance becomes a dominant delay time in the operation of the logic gate. Using the third OTS switch in place of the load resistor solves this problem. In the circuit of FIG. 7, the key advantage is that the current density through the OTS is used to both charge and discharge the output capacitance. This forms an almost ideal gate. It is small in size, yet it can deliver a current pulse with the only limitation being the current capacity of the contacts. The circuit shown in FIG. 7 exhibits the logic characteristics of INVERSIONS and is termed an "IMPROVED-INVERTER" logic gate.

The circuit shows in FIG. 7, employs only a single input resistor. However, the present invention may employ any number of input resistors. The input resistors used may all have different values or the same value, depending upon the application. Furthermore, the set of input resistors may be replaced by a more generalized input function employing one or more inputs, a linear or nonlinear electronic system acting on those inputs, and an output connected between OTS1 and OTS2.

Figure 9:
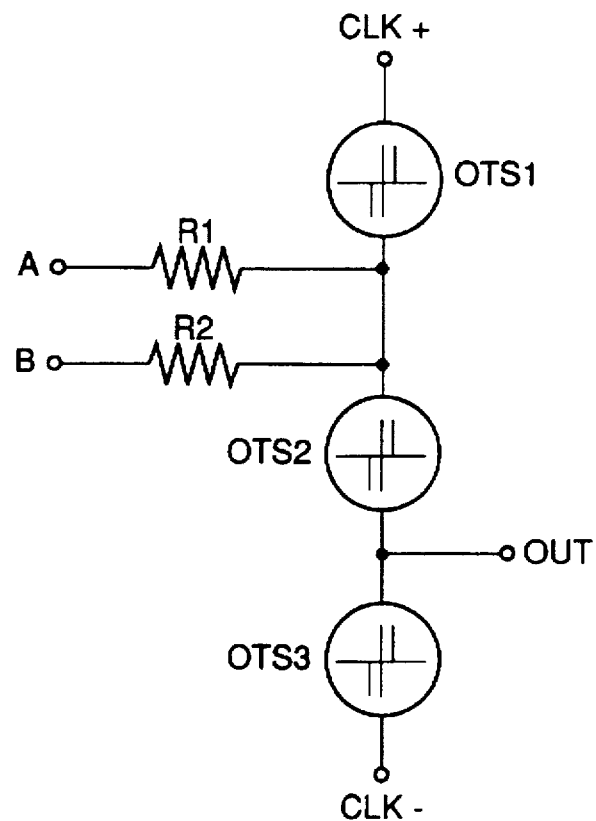
FIG. 9 depicts a multiple input logic circuit which performs a logical operation using three two terminal chalcogenide threshold switches.

An embodiment of the present invention using two input resistors is shown in FIG. 9. Like the circuit shown in FIG. 5, the circuit of FIG. 9 operates to perform a logical operation. If the input at either A or B is high or the input at both A and B are high, OTS1 does not switch. Therefore, OTS2 does not switch and the output is low. However, if the input at both A and B is low, OTS1 switches. This causes the potential across OTS2 to be high causing it to switch and pull the output at OUT high. Depending upon the nomenclature used, this is either a NOR gate or a NAND gate. This is, if a low potential is a logical "0" and a high potential is a "1" then the circuit acts as a NOR gate. Conversely, if a low potential is a "1" and a high potential is a "0" then the circuit acts as a NAND gate. The circuit is labeled an "IMPROVED-NOR" logic gate.

The logic gates comprising chalcogenide threshold switches may be used as integrated drivers for many different types of circuits. In particular, they may be used as integrated drivers for flat panel displays. The most significant factor in the cost of flat panel displays is currently the peripheral circuitry used to electrically drive the rows and columns of the display. This circuitry is conventionally fabricated from crystalline silicon CMOS integrated circuits which must be attached to the glass panel of the display.

Polycrystalline silicon transistors have been employed to produce this drive circuitry as well. These transistors are fabricated directly on the display glass, which substantially reduces the cost of the display by eliminating the need to attach separate driver circuits. Unfortunately, polycrystalline silicon transistors must be fabricated at high processing temperatures, so expensive quartz substrates must be used. The additional cost of the quartz substrate offsets the cost savings of integrating the drivers.

Driver circuitry employing amorphous silicon thin-film transistors has been attempted because these transistors can be deposited on low temperature glass substrates. These transistors have insufficient current capacity to meet the demanding application of driving flat panel displays, so they have been unsuccessful.

The present invention uses logic gates comprising chalcogenide threshold switches to implement the logical function of the peripheral circuitry. The chalcogenide threshold switches have a high current capability that will permit them to be used as display drivers. They can be deposited at low temperatures, and so are compatible with conventional glass substrates.

The circuitry necessary to implement this peripheral logic function comprises both row and column drivers. Row drivers are used to activate one line of the display and the column drivers set each pixel along that row to the appropriate intensity. The circuitry for the row drivers includes a shift register which shifts a selection signal to each successive row, and a row driving circuit attached to each row of the display.

The shift register shifts in and stores a sequence of digital input data. An embodiment of the shift register is a connected sequence of INVERTER logic gates. The INVERTER circuit has already been described and which is shown is FIG. 4. The INVERTER's are connected so that the output point of one INVERTER is connected to a unique input point of the next INVERTER in the connected sequence.

Figure 10:
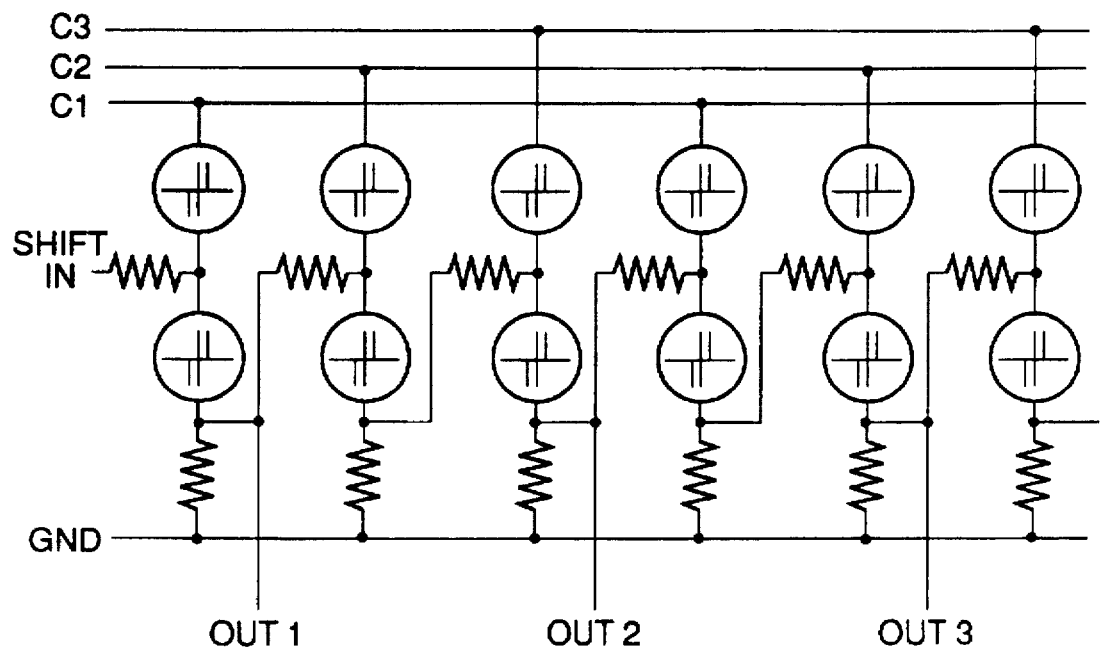
FIG. 10 depicts a row shift register circuit used to shift a selection signal to each successive row line.

The embodiment of the row shift register shown in FIG. 10 utilizes a three-phase clocking system. The CLK terminal of each INVERTER logic gate is connected to the appropriate phase (C1, C2 or C3 as shown in FIG. 3) of the three-phase clock signal. The ground resistors of each of the logic gates are connected to a common ground point.

During each clock cycle, the voltage level at the output of one gate is inverted and the inverted value shifted to the output of the next gate. Hence, if the output of the first is gate is high, the output of the next will be low after first clock cycle. As the clock cycles, the inputs that appear at the input of the register are inverted and shifted to the next gate.

Figure 11:
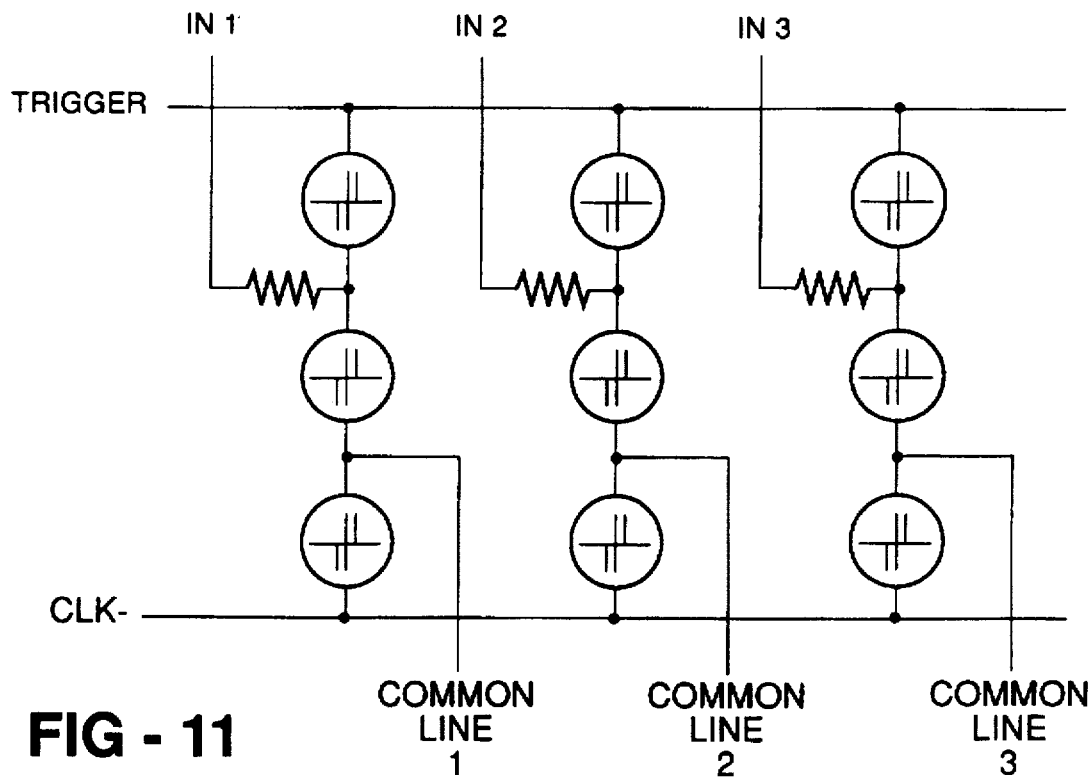
FIG. 11 depicts a row driving circuit for activating row lines and supplying a high drive current to the row lines.

The circuitry for activating each of the row lines also includes a row driving means. The row driving means for activating the row lines of the LCD display must be capable of supplying a high drive current to the display, typically greater than 100 milliamperes of current. FIG. 11 shows an embodiment of the row driving portion of the row driver circuit. The row driver circuitry of each row line is comprised of an improved INVERSION circuit in which the ground resistor has been replaced with a third OTS that is connected to GND, a ground point. This circuit have been labeled an IMPROVED-INVERTER. The activation points of each of the IMPROVED-INVERTER's is connected to a common activation point. The common activation point is triggered by a clock signal denoted in FIG. 11 as "TRIGGER". The reset points of each of the IMPROVED-INVERTER's is connected to a common reset point. The significance of the third OTS has been discussed above. It can provide ideal switching characteristics during conditions of high current loading.

During succeeding clock pulses, the row shift register shifts and inverts the sequence of data at the input of the first INVERTER logic gate in the connected sequence of INVERTER's. The input sequence is denoted as "SHIFT-IN" FIG. 10. The inverted sequence of data values appear at the outputs of the first, third and fifth logic gates of the shift register after the first, third and fifth clock pulses. These outputs are OUT1, OUT2 and OUT3 respectively. These outputs are applied to the inputs IN1, IN2 and IN3 of each of the IMPROVED-INVERTER logic drivers of the row driving circuit portion of the row driver circuitry that is shown in FIG. 11. Hence, shifting in the appropriate sequence of data values (i.e. "SHIFT IN") at the input of the row shift register shown in FIG. 10 will sequentially activate and properly drive the Common Lines 1, 2 and 3 that are shown in FIG. 11.

The column driver means is comprised of three subsystems. There is the column shifting means for shifting a sequence of digital pixel intensity data, the decoder means for converting the digital pixel intensity data into a digital decoder output signal, and the digital conversion means for converting the digital decoder output signal into analog pixel intensity data.

Figure 12:
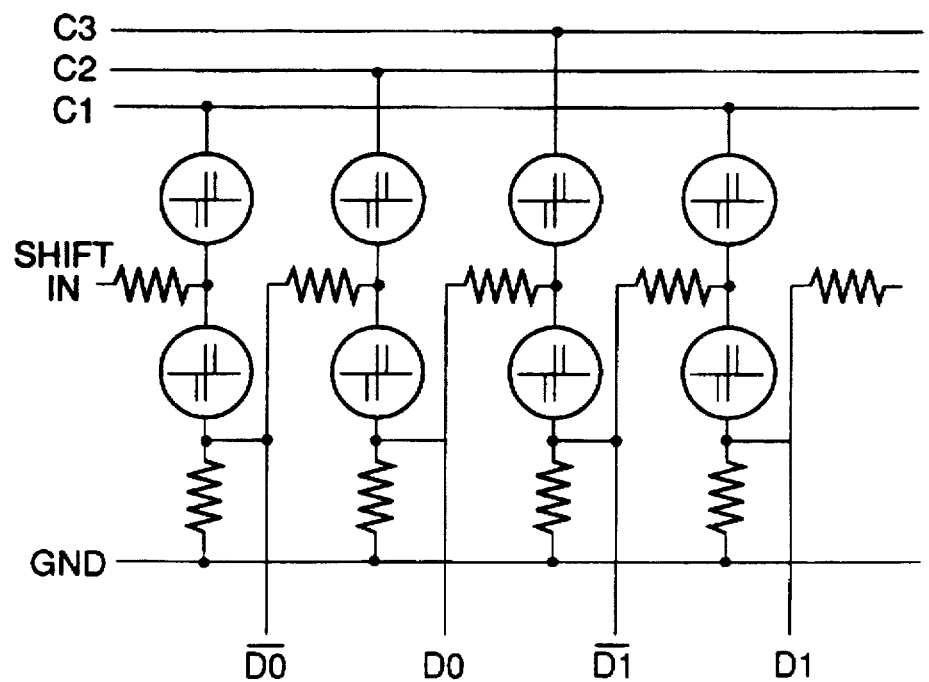
FIG. 12 depicts a column shift register circuit used for shifting the digital, multiple bit, voltage level data to the appropriate columns.

An embodiment of the column shifting means is shown in FIG. 12. The column shift register shown is similar to the row shift register shown in FIG. 10. The shift register is comprised of a sequence of INVERTER circuits wherein the output of one INVERTER is connected to the input of the next inverter in the connected sequence. The shift register shifts the digital, multiple-bit voltage level data to the appropriate columns.

The shift register shown in FIG. 12 is an embodiment for a four-level gray scale. Two digital values, D0 and D1, are needed to represent the four gray scale levels for each column of a flat panel display. In order to correctly implement this embodiment of the column driver system of the present invention, four data values must be shifted into the shift register for each column of the display. These four values are the sequence (-D0, D0, -D1 and D1). -D0 and -D1 represent the complement of D0 and D1 respectively. Hence, if D0 is high, then -D0 is low.

Figure 13:
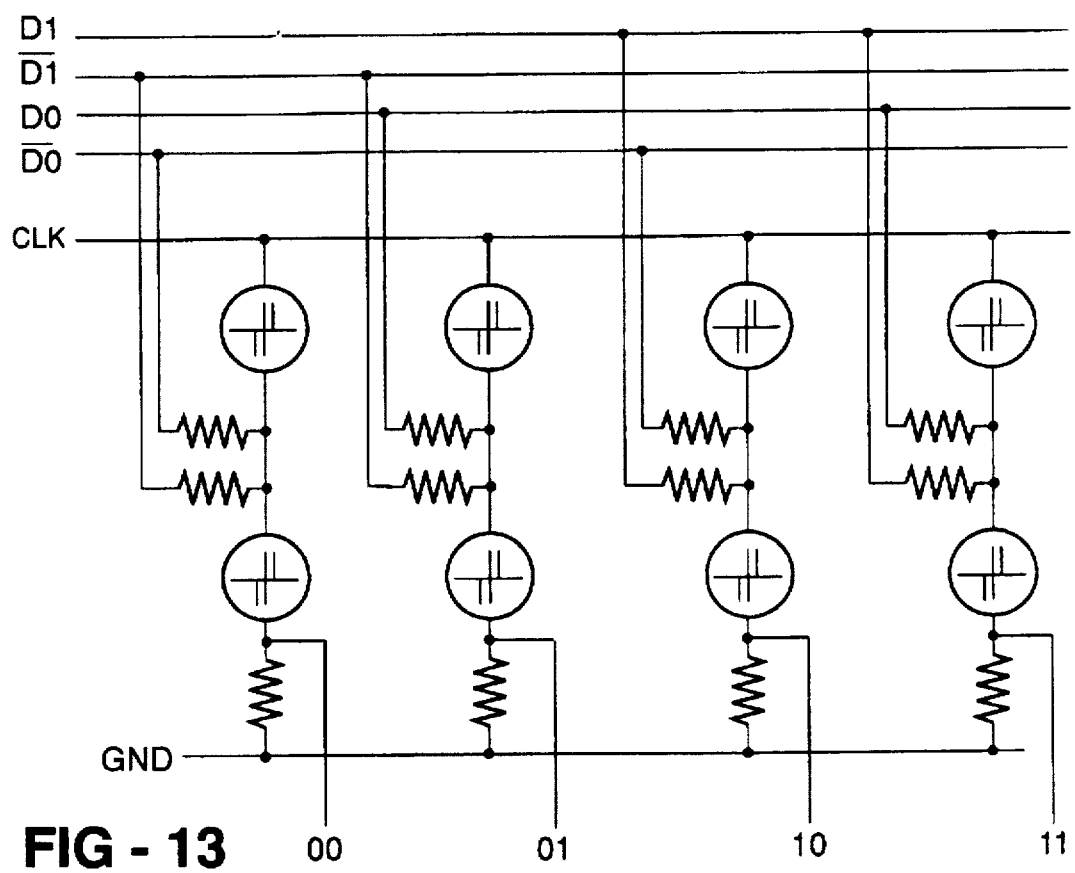
FIG. 13 depicts a two-to-four decoder circuit used to decode the digital voltage levels.

The data represented by the digital sequence of values (-D0, D0, -D1, D1) must then be decoded so that a particular digital sequence is translated into a single voltage that will be applied to a column. In general, a decoding means is responsible for accomplishing this function. An embodiment of a decoding means is shown in FIG. 13. FIG. 13 shows a decoding circuit comprised of a plurality of logic gates where each gate is a two-input NOR logic gate. The activation point for each NOR logic gate is connected to a common activation point. Each of NOR logic circuits has two input points which are selected from the sequence (-D0, D0, -D1, D1).

The operation of each of the two-input logic gate used has been explained earlier. Briefly, if either of the inputs is high or if both of the inputs are high, neither of the OTS's will switch and the output will be low. However, if both of the inputs are low, both OTS's will switch and the output will be high. Hence, only one combination of input values will set the output of the logic gate high. This idea is used in the embodiment of the decoder circuit shown in FIG. 13. The two inputs of each of the logic gates are connected to a particular combination of the digital data (-D0, D0, -D1, D1). The possible inputs of the logic gates are (-D0,-D1), (D0, -D1), (-D0, D1) and (D0, D1). The combination of inputs are chosen so that no matter what the values of D0 and D1, only one of the combinations will be a (low, low) and hence, only one of the logic gate outputs will be high.

The embodiment of the decoder circuit shown in FIG. 13 is for decoding two digital inputs, D0 and D1. More than two inputs may be decoded by using NOR logic gates with a greater number of input resistors connected between the pairs of threshold switches. As well, the decoder circuit may also be implemented using the IMPROVED-NOR logic gate shown in FIG. 9.

The final subsystem of the column driver system is a digital conversion means needed to convert the digital signal from the decoder circuitry into an analog value that determines the gray level for each of the columns. The digital conversion means will select an analog output based upon the values of digital inputs.

Figure 14:
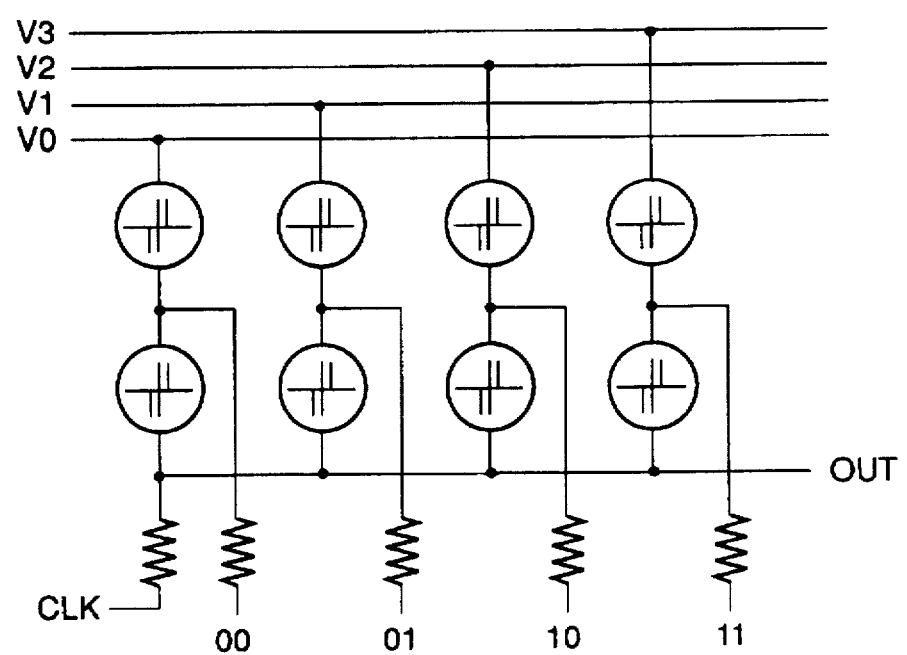
FIG. 14 depicts a digital-to-analog converter used to supply analog voltage levels to each of the columns.

FIG. 14 shows an embodiment of a digital conversion means as a digital-to-analog converter comprising a plurality of logic gates where each gate is formed from chalcogenide threshold switches. Each logic gate comprises a first OTS connected at one end to a second OTS and at the other end to an analog voltage point. For each logic gate, an input resistor in connected at one end to a point between the two OTS's. The other end of each input resistor is connected to a unique input point. A common digital-to-analog output point is connected to the second threshold switch of each logic gate at a point opposite the junction between the first and second threshold switches. The common digital-to-analog output point is connected to one end of a clocking resistor. The other end of the clocking resistor is connected to an activation point. The activation point is connected to clock trigger signal, CLK.

The digital-to-analog converter selects an output value from the set of values (V0, V1, V2, V3). The output selected depends upon which of the input values from the decoder (00, 01, 10, 11) is low. If, for example, the input 00 is high, the potential across OTS1 will not be sufficient to switch OTS1. However, when the input 00 is low, there will be sufficient voltage across OTS1 for it to switch. The chosen analog voltage will be selected and appear on the common analog-to-digital output when the clock trigger signal goes to the appropriate value.

The row and column drivers described above may be applied to other uses besides flat panel displays. These include row and column driver circuitry for digital memory and sensor applications.

While the invention has been described in connection with preferred embodiments and procedures, it is to be understood that it is not intended to limit the invention to the described embodiments and procedures. On the contrary it is intended to cover all alternatives, modifications and equivalence which may be included within the spirit and scope of the invention as defined by the claims appended hereinafter.

We claim:

1. A logic operational circuit comprising:
   a least one logic gate wherein each logic gate comprises:
   a first chalcogenide threshold switch connected at one end to an activation point and at the other end to a second chalcogenide threshold switch;
   at least one input resistor, each input resistor connected at one end between said first and second threshold switches and at the other end to a unique input point;
   a third threshold switch connected at one end to said second threshold switch at a terminal opposite that of a junction of said first and second threshold switches, said third threshold switch connected at the other end to a reset point; and
   an output point connected between said second and said third threshold switches.

2. The logic operational circuit of claim 1, wherein said circuit employs multi-phase clocking.

3. The logic operational circuit of claim 2, wherein said multi-phase clocking is three-phase clocking.

4. The logic operational circuit of claim 2, wherein said multi-phase clocking is four-phase clocking.

5. The logic operational circuit of claim 4, wherein said four-phase clocking employs a fifty percent duty cycle.

6. The logic operational circuit of claim 1, wherein said at least one input resistor is a single input resistor connected at one end to a unique input point and at the other end between said first and second chalcogenide switches.

7. A display driver for driving a flat panel display having rows and columns, said display driver comprising:
   row driver means for activating said rows of said flat panel display; and
   column driver means for setting pixel intensity values for each of said activated rows;
   wherein said row driver means and said column driver means each comprise a plurality of logic gates where each logic gate comprises:
   a first and a second chalcogenide threshold switch connected in series; and
   at least one input resistor, each input resistor connected at one end to a point between said first and said second threshold switches and at the other end to a unique one of at least one input point.

8. The display driver of claim 7, wherein each of said plurality of logic gates includes one or more logic gates selected from the group consisting of INVERTER, IMPROVED-INVERTER, NOR, IMPROVED-NOR and combinations thereof, wherein
   said INVERTER comprises:
   a first chalcogenide threshold switch connected at one end to a second chalcogenide threshold switch and at the other end to an activation point;
   an input resistor connected at one end to a point between said first and said second threshold switches and at the other end to a unique input point;
   a ground resistor connected at one end to said second threshold switch at a terminal opposite that of a junction of said first and said second threshold switches, said ground resistor connected at the other end to ground; and
   an output point connected between said second threshold switch and said ground resistor;
   said IMPROVED-INVERTER comprises:
   a first chalcogenide threshold switch connected at one end to a second chalcogenide threshold switch and at the other end to an activation point;
   an input resistor connected at one end to a point between said first and said second threshold switches and at the other end to a unique input point;
   a third threshold switch connected at one end to said second threshold switch at a terminal opposite a junction between said first and said second threshold switches and at the other end to a reset point; and
   an output point connected between said second and said third threshold switches;
   said NOR comprises:
   a first chalcogenide threshold switch connected at one end to a second chalcogenide threshold switch and at the other end to an activation point;
   a plurality of input resistors, each connected at one end to a point between said first and said second threshold switches and at the other end to a unique one of a plurality of input points;
   a ground resistor connected at one end to said second threshold switch at a terminal opposite that of a junction of said first and said second threshold switches, said ground resistor connected at the other end to ground; and
   an output point connected between said second threshold switch and said ground resistor;
   said IMPROVED-NOR comprises:
   a first chalcogenide threshold switch connected at one end to a second chalcogenide threshold switch and at the other end to an activation point;
   a plurality of input resistors, each connected at one end to a point between said first and said second threshold switches and at the other end to a unique one of a plurality of input points;
   a third threshold switch connected at one end to said second threshold switch at a terminal opposite a junction between said first and said second threshold switches and at the other end to a reset point; and
   an output point connected between said second and said third threshold switches.

9. The display driver of claim 8, wherein said plurality of logic gates employ multi-phase clocking.

10. The display driver of claim 9, wherein said multi-phase clocking is three-phase clocking.

11. The display driver of claim 9, wherein said multi-phase clocking is four-phase clocking.

12. The display driver of claim 11, wherein said four-phase clocking has a fifty percent duty cycle.

13. The display driver of claim 7, wherein said row driver means comprises:
    row shifting means for shifting a sequence of row activation data that controls the activation of said rows; and
    row driving means for activating said rows.

14. The display driver of claim 7, wherein said column driver means comprises:
    column shifting means for shifting a sequence of digital pixel intensity data;

decoder means for converting said digital pixel intensity data into a digital decoder output signal; and digital conversion means for converting said digital decoder output signal into analog pixel intensity data.

15. The display driver of claim 13, wherein said row shifting means comprises:

a connected sequence of INVERTER's wherein said output point of one INVERTER is connected to a unique input point of the next INVERTER in said connected sequence;

a row shifter input point connected to the first INVERTOR in said connected sequence.

16. The display driver of claim 13, wherein said row driving means comprises:

at least one IMPROVED-INVERTER, wherein
the activation point of each IMPROVED-INVERTER is connected to a common activation point, and
the reset point of each IMPROVED-INVERTER is connected to a common reset point.

17. The display driver of claim 14, wherein said column shifting means comprises:

a connected sequence of INVERTER's wherein said output point of one INVERTER is connected to a unique input point of the next INVERTER in said connected sequence; and a column shifter input point connected to the first INVERTER in said connected sequence.

18. The display driver of claim 14, wherein said decoder means comprises:

a plurality of NOR's wherein said activation point of each of said plurality of NOR's is connected to a common activation point.

19. The display driver of claim 14, wherein said digital conversion means comprises:

a plurality of logic gates wherein each logic gate comprises:
a first chalcogenide threshold switch connected at one end to a second chalcogenide threshold switch and at the other end to an analog voltage point; and
an input resistor connected at one end to a point between said first and said second threshold switches, and at other end to an input point;

a common digital-to-analog output point connected to said second threshold switch of each of said plurality of logic gates at a terminal opposite a junction of said first and said second threshold switches; and a clocking resistor connected at one end to said common digital-to-analog output point and at the other end to an activation point.

* * * * *